United States Patent [19]

Kugelmann et al.

[11] 3,987,392
[45] Oct. 19, 1976

[54] LUMINESCENT VOLTAGE INDICATOR CIRCUIT

[75] Inventors: Adolf Kugelmann, Leonberg; Helmut Keller, Reutlingen, both of Germany

[73] Assignee: Robert Bosch G.m.b.H., Stuttgart, Germany

[22] Filed: June 18, 1974

[21] Appl. No.: 480,399

[30] Foreign Application Priority Data
June 22, 1973 Germany............................ 2331660

[52] U.S. Cl................................... 324/96; 73/293; 73/499; 324/115; 330/69; 330/124 R; 340/172; 340/324 R; 340/379; 307/235 N; 240/8.16

[51] Int. Cl.²................................. G01R 31/00

[58] Field of Search .......... 324/96, 99 D, 115, 122; 73/293, 499; 340/172, 62, 324 R, 378 R, 379, 253 N, 372, 339; 315/131, 132; 330/69, 124 R; 240/2.1, 8.16; 246/122 R, 122 A; 307/235 N, 311; 250/552

[56] References Cited
UNITED STATES PATENTS

| | | | |
|---|---|---|---|
| 2,848,685 | 8/1958 | Mondschein...................... | 324/122 |
| 2,930,888 | 3/1960 | Crawford et al................. | 246/122 R |
| 3,103,646 | 9/1963 | Sheaffer, Jr. et al. .......... | 340/172 X |
| 3,114,057 | 12/1963 | Caruso............................ | 330/69 UX |
| 3,448,334 | 6/1969 | Frost............................. | 340/378 R X |
| 3,457,560 | 7/1969 | McKinley.................... | 307/235 N X |
| 3,486,499 | 12/1969 | Yen .............................. | 330/69 X |
| 3,487,263 | 12/1969 | Pahlavan..................... | 340/378 R X |
| 3,595,991 | 7/1971 | Diller .......................... | 340/378 R X |
| 3,705,316 | 12/1972 | Burrous et al..................... | 307/311 |
| 3,719,772 | 3/1973 | Roth ........................... | 330/124 R |
| 3,740,570 | 6/1973 | Kaelin......................... | 340/378 R X |
| 3,766,474 | 10/1973 | MacDonald .................... | 324/96 X |
| 3,770,966 | 11/1973 | Sagawa......................... | 250/552 X |
| 3,772,514 | 11/1973 | Sunderland..................... | 250/552 X |
| 3,795,863 | 3/1974 | Umeda et al. .................... | 324/96 X |
| 3,796,951 | 3/1974 | Joseph ......................... | 324/122 |
| 3,803,419 | 4/1974 | Obenhaus...................... | 250/552 X |
| 3,825,827 | 7/1974 | Tumbush .................... | 324/96 X |
| 3,835,331 | 9/1974 | Thorngate et al. ............... | 250/552 |
| 3,872,386 | 3/1975 | Luhowy........................... | 324/96 X |

*Primary Examiner*—Stanley T. Krawczewicz
*Attorney, Agent, or Firm*—Flynn & Frishauf

[57] ABSTRACT

A plurality of luminescent elements, such as light-emitting diodes, incandescent lamps or the like, are located adjacent each other, each connected to the output of a difference amplifier. The respective inputs of the difference amplifier are connected, on the one hand, to a voltage divider to have different reference voltages applied thereto and, on the other, in common to the input voltage to be sampled so that, as the voltage changes between the amplification ranges of the difference amplifiers, the output therefrom will change in accordance with input voltage so that the brightness of the respectively connected luminescent elements will also change, thus providing gradual increase in brightness of any individual element as the voltage changes. The difference amplifiers may be differentially connected operational amplifiers.

20 Claims, 13 Drawing Figures

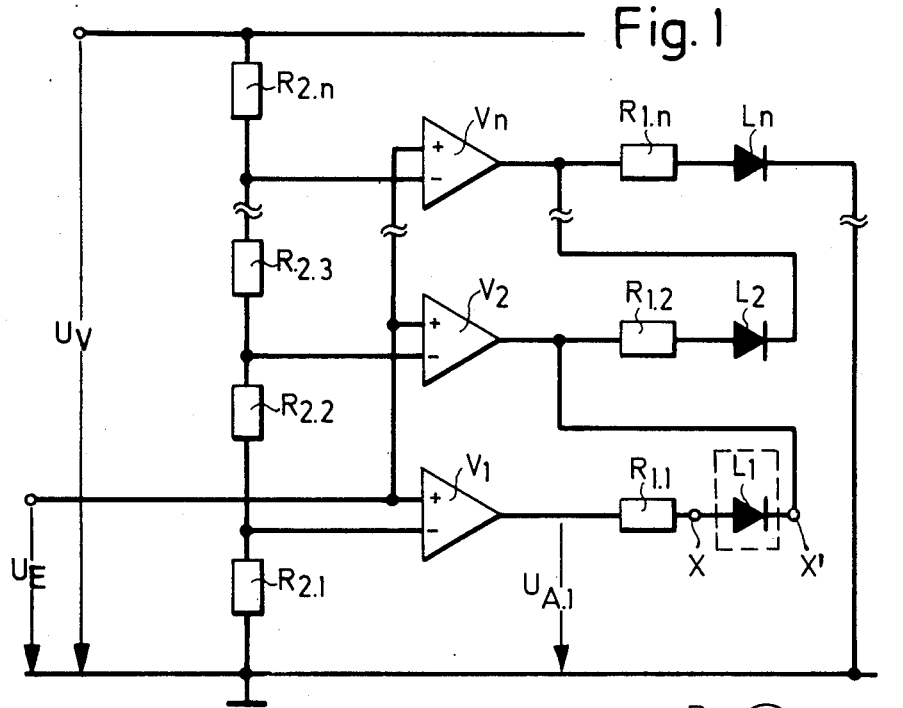
Fig. 1
Fig. 1c
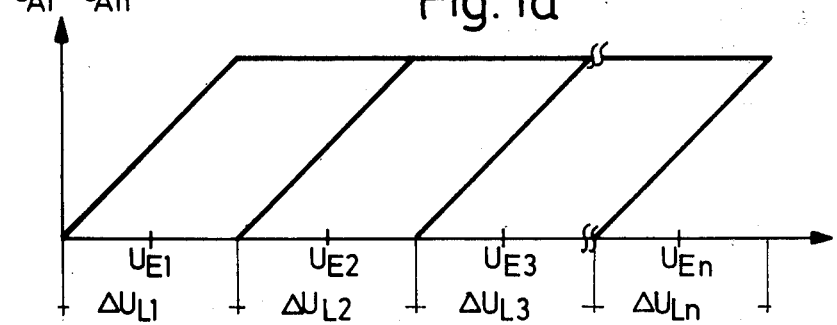
Fig. 1a
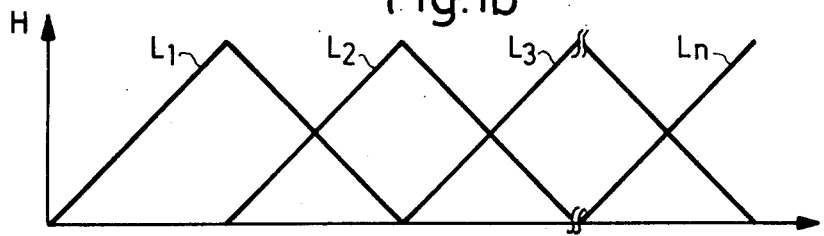
Fig. 1b

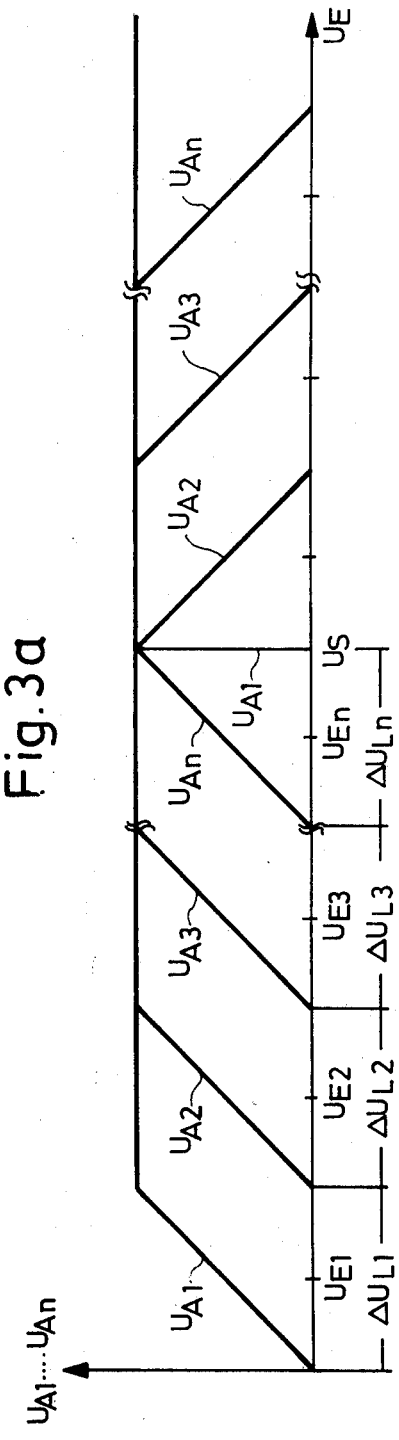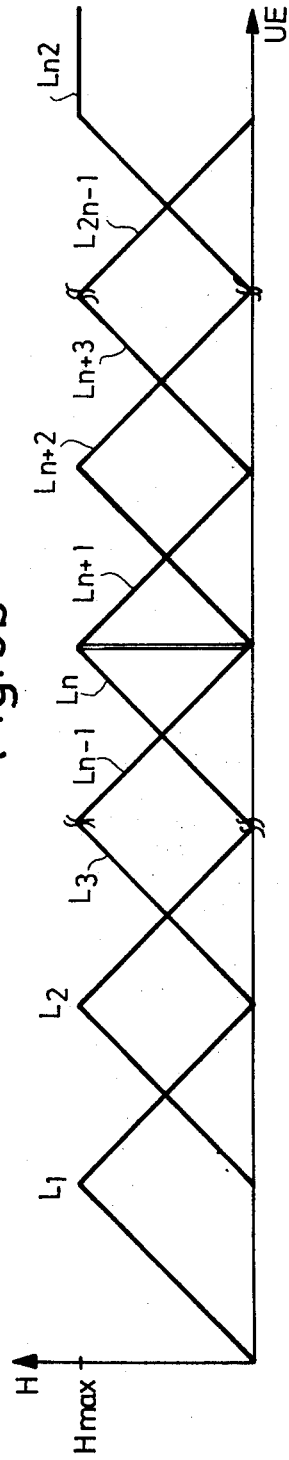

3,987,392

LUMINESCENT VOLTAGE INDICATOR CIRCUIT

The present invention relates to a circuit arrangement to indicate the value of a d-c voltage by using a plurality of adjacently arranged electro-optical indicators representing voltage values by their position or by association with indicia. The indicators may be incandescent lamps, luminescent diodes, liquid crystals, or the like.

Electrically illuminated light elements used as indicators, to represent electrical values, for example the voltage value, are known. The voltage value is then indicated by energizing one of the indicator elements to become luminescent; alternatively, all indicators up to the one representing a certain value may become luminescent. It is also possible to so construct the circuit that those indicators become luminescent which represent values above the voltage to be measured, only. In any event, the indicators are operated at full brightness, either ON or OFF; the connection and disconnection of the respective indicators is abrupt, the brightness of the indicators, when connected, being constant.

It is an object of the present invention to provide a circuit arrangement in which change in a voltage to be indicated provides for an optical analog of the slow movement of an indicator needle, by increasing brightness upon change of the voltage to be indicated, to provide a quasi-continuous optical impression; and, which further is suitable for use with integrated monolitic semiconductor technology.

Subject matter of the present invention: Briefly, each indicator element (which may be an incandescent lamp, a luminescent diode, a liquid crystal, or another electro-optical transducer) has a difference amplifier associated therewith, the output of which is connected to the respective indicator element. The difference amplifier has one of its inputs, for example the inverting input, connected to various fixed reference voltage levels; the other input, typically the direct input, is connected with the voltage to be indicated (the connection of the difference amplifier may be reversed). The indicators then will provide a travelling spot of light, with continuous transfer of light brightness, or intensity, between adjacent indicator elements in the chain, connected to the outputs of the difference amplifiers.

In some installations it is desirable to indicate change in voltage level by providing a band of light, the length of which changes. The circuit can readily be modified by connecting the electrodes of the indicator elements not in a chain, with the preceding difference amplifier, but rather to a fixed potential (for example to ground or chassis level). By connecting additional indicator elements at selected positions, or between selected difference amplifiers, specific voltage levels can be accentuated, or especially indicated (for example by means of indicators providing a different color) to provide a warning, or alarm, when the voltage level exceeds a predetermined value; or when the difference between voltage levels at two respective inputs to respective difference amplifiers passes certain levels.

The invention will be described by way of example with reference to the accompanying drawings, wherein:

FIG. 1 illustrates, in abbreviated schematic form, a circuit to provide a travelling spot of light with continuous transfer of brightness from one indicator element to the next;

FIG. 1a shows the output voltage of difference amplifiers in the circuit of FIG. 1, in dependence on d-c voltage to be indicated;

FIG. 1b is a diagram illustrating the brightness of the indicator elements of the circuit of FIG. 1 in dependence on voltage to be indicated;

FIG. 1c is a fragmentary schematic diagram illustrating a modification of the circuit of FIG. 1;

FIG. 3a is a diagram illustrating the output voltages of the difference amplifiers in the circuit of FIG. 3 in dependence on d-c voltage to be indicated;

FIG. 3b is a diagram illustrating the brightness of the indicators in the circuit of FIG. 3a in dependence on d-c voltage to be indicated;

Figure 2:
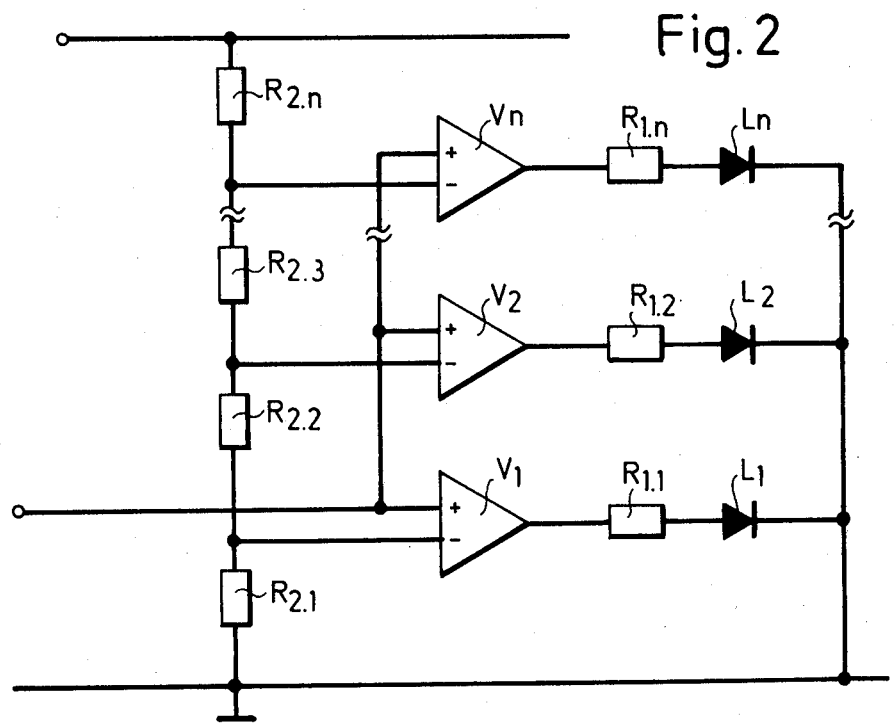
FIG. 2 is a schematic circuit diagram in which a d-c voltage to be indicated is represented by a strip or band of light, formed by adjacent light-emitting elements.

$L_1, L_2 \ldots L_n$ are indicator elements, shown in FIG. 1 as light-emitting diodes (LED's). Resistors $R_{1,1}, R_{1,2} \ldots R_{1,n}$ are connected in series with the LED's $L_1 \ldots L_n$, respectively, and, in turn, connected to the output of respective amplifiers $V_1, V_2 \ldots V_n$. The $V_1 \ldots V_n$ amplifiers are difference amplifiers connected in a chain, each, having amplification factors of $v_1, v_2 \ldots v_n$. The d-c voltage to be indicated is shown at $U_E$. A supply voltage $U_V$ is connected across a voltage divider formed of series connected resistors $R_{2,1}, R_{2,2} \ldots R_{2,n}$. The maximum voltage $U_e$ which can be sensed cannot exceed $U_V$, which voltage determines the direct indicating limit of the circuit. All the direct inputs of the difference amplifiers $V_1 \ldots V_n$ are galvanically connected together and, further, connected to the voltage $U_E$ to be indicated. The inverting inputs of the difference amplifiers $V_1 \ldots V_n$ are connected to a respective tap point of the voltage divider formed by the adjacent series connected resistors; thus, amplifier $V_1$ is connected between the resistors $R_{2,1}$ and $R_{2,2}$. The input resistance of the difference amplifiers $V_1$ to $V_n$ must be high with respect to the resistance of the voltage divider resistors $R_{2,1} \ldots R_{2,n}$.

The output of the highest difference amplifier $V_n$ is connected to the coupling resistor $R_{1,n}$ and to the anode of the highest LED $L_n$, the cathode of which is connected to chassis or ground. The amplification factors $v_1 \ldots v_n$ of the difference amplifiers $V_1 \ldots V_n$ is preferably so selected that the maximum output voltage swing $U_A$ is derived when the voltage $U_E$, applied to the respective difference amplifier, passes the associated voltage range.

Operation, with reference to FIGS. 1a and 1b: Let it be assumed that the test voltage $U_E$ connected to the common direct input of the difference amplifiers $V_1 \ldots V_n$ changes from zero voltage to a positive value. First, the output of difference amplifier $V_1$ will become more positive with respect to the outputs of the difference amplifiers $V_2, V_3 V_n$. Current will flow from the output of the difference amplifier $V_1$ over resistor $R_{1,1}$ and over the first indicator element $L_1$ to the output of the difference amplifier $V_2$. This current will be proportional to the voltage difference in the two outputs. The output voltage $U_{A1}$ of the difference amplifier $V_1$ is proportional to the test or sampled voltage $U_E$ until the maximum output voltage from the amplifier $V_1$ is reached. If the voltage $U_E$ increases, the output voltage of the difference amplifier $V_2$ will then increase, so that the voltage difference at the output of the difference amplifier $V_1$ with respect to the voltage at the output of the difference amplifier $V_2$ will become less. Current will decrease through the resistor $R_{1,1}$ and LED $L_1$; current will, however, flow in increasing intensity, depending on input voltage, through resistor $R_{1,2}$ and LED $L_2$ to the difference amplifier $V_3$ (not shown, and assumed part of the chain of FIG. 1). This causes a drop in light intensity from LED $L_1$, which will decrease in brightness. The brightness of the indicator element $L_2$ will, however, increase. As the sampling voltage $U_E$ increases, the cycle will repeat with respect to the further indicator elements.

The voltage division ratio of the voltage divider resistors $R_{2,1}$ to $R_{2,n}$, and/or the amplification of the amplifier $V_1$ to $V_n$ may be suitably selected, and need not be linear; thus, non-linearities in the respective resistance values (or amplification factors) can be built into the circuit to provide linear outputs for non-linear inputs; or to provide a non-linear output with linear input.

The luminescent element need not be a light-emitting diode, but may be a liquid crystal; if the light-emitting element does not have inherently unidirectional current passing characteristics, it is desirable to include a decoupling diode in series therewith. Thus, if the circuit of FIG. 1 is broken at terminals X, X' and the LED $L_1$ is replaced by an incandescent bulb B (FIG. 1c), then a diode D is preferably inserted in series therewith.

Figure 2A:
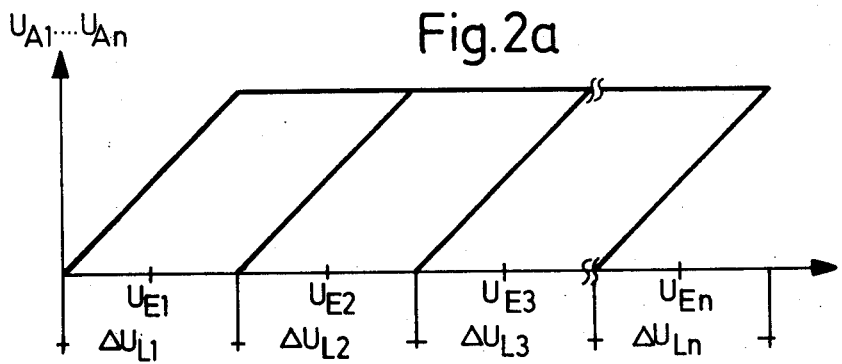
FIG. 2a is a diagram of the output voltages of the difference amplifiers in the circuit of FIG. 2 in dependence on the d-c voltage to be indicated.
Figure 2B:
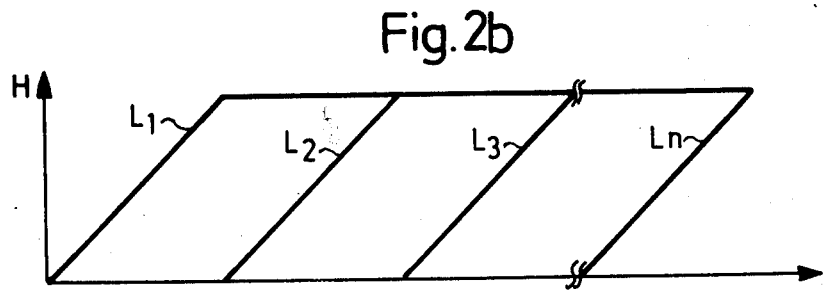
FIG. 2b is a diagram illustrating the brightness of the indicator elements in the circuit of FIG. 2, in dependence on voltage to be indicated.

In some applications, it is desired to provide a band or strip of light, rather than a moving illuminated zone, as the input voltage changes. The circuit of FIG. 1 can readily be modified, as illustrated in FIG. 2. Similar elements, operating similarly, have been given the same reference numerals throughout and will not be described again. In contrast to the circuit of FIG. 1, the connections of the LED's $L_1, L_2 \ldots L_{n-1}$ are not connected with their cathodes to the output of the next higher difference amplifier but, rather, are connected to a fixed source of potential, in the example illustrated to ground or chassis. The last LED $L_n$ is already so connected. The operation of the circuit of FIG. 2 is similar to that of FIG. 1, with the difference that the lower LED's are not extinguished as the voltage increases, but rather remain illuminated - compare FIGS. 1b and 2b, in which the ordinate H indicates lamp brightness. The voltages of the difference amplifiers $V_1 \ldots V_n$ will, of course, be the same as indicated by comparing FIGS. 1a and 2a, in which the ordinate indicates the respective voltage provided by the respective difference amplifiers with respect to change of input voltage.

Figure 3:
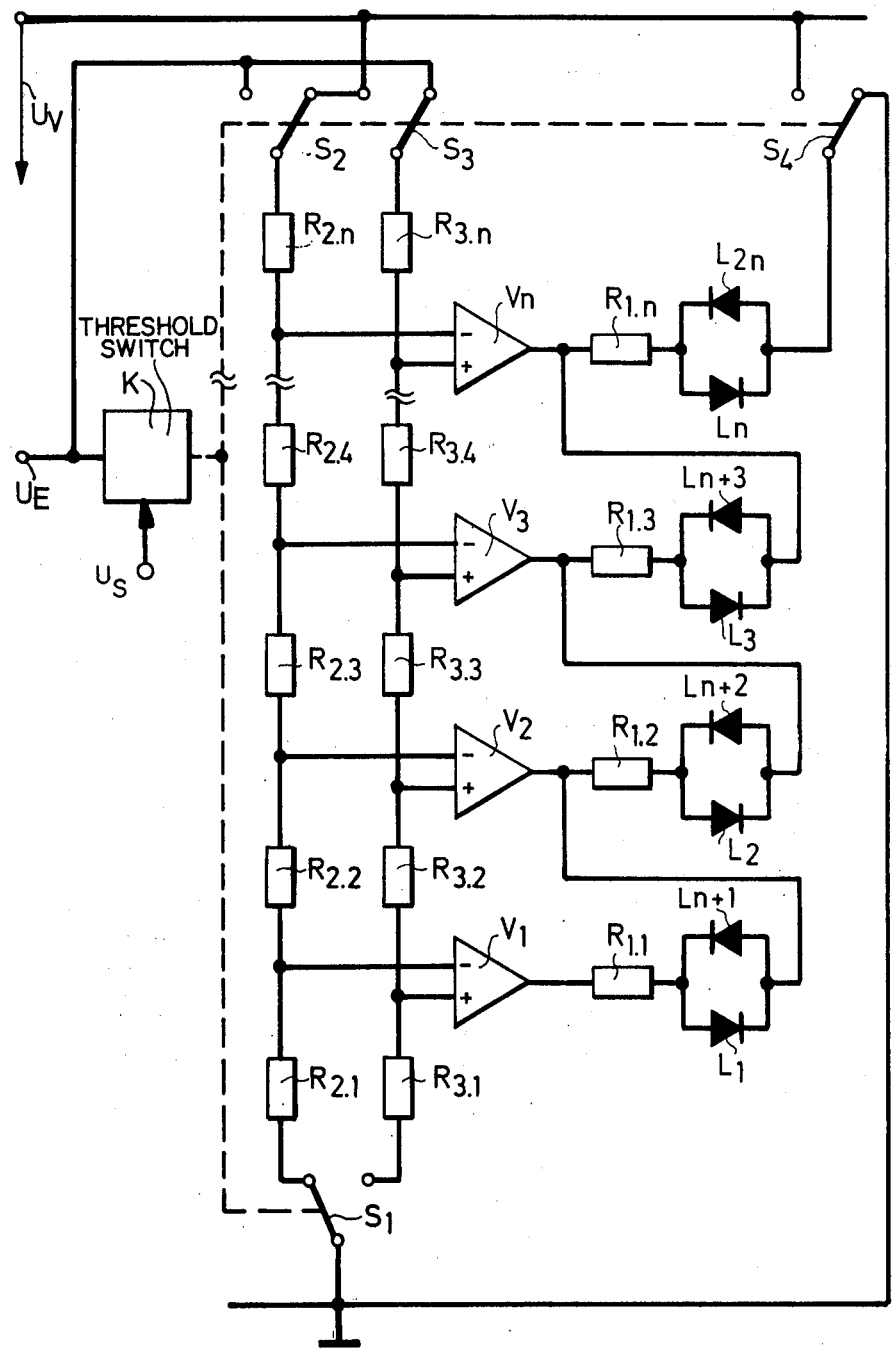
FIG. 3 is a schematic circuit diagram of a modification of the circuit of FIG. 1 to generate a travelling spot of light with continuous transfer of brightness from indicator to indicator and utilizing a lesser number of components.

The circuits, as described, can readily be constructed as an integrated circuit. When integrated circuits are used, the number of the necessary connections to the indicator elements can be reduced by including a switch-over connection. Referring now to FIG. 3, which also permits a reduction in the number of amplifiers: The two inputs of the amplifiers $V_1$ to $V_n$ are connected, respectively, to the tap point of a respective voltage divider. In addition to the voltage dividers previously used, a third voltage divider $R_{3,1}, R_{3,2} \ldots R_{3n}$ is used. The switch $S_1, S_2, S_3$ transfers the terminal ends of the voltage dividers, respectively, to the supply voltage $U_V$ or to the sampling voltage $U_E$. An additional switch contact $S_4$ is used to suitably switch-over the indicator connected to the last amplifier $V_n$. The switches $S_1$ to $S_4$, which are transfer switches, may be mechanical or may be electronic switches. The switches $S_1$ to $S_4$ are transferred when a threshold switch K senses a threshold voltage $U_s$, in accordance with the relationship:

$$U_s = U_{En} + \Delta\ U_{Ln}/2 \tag{1}$$

in which $U_s$ is the threshold voltage of threshold switch K; $U_{En}$ is the input voltage of the amplifier $V_n$ when the output voltage $U_{An}$ has reached its half value between its range of amplified output; and $\Delta\ U_{Ln}$ is the input voltage range of the amplifier $V_n$ in its active, amplification range. Threshold switch K thus operates as a comparator providing a switching transfer signal when the voltage $U_E$ at its input exceeds the threshold level or voltage $U_S$. Any conventional threshold switch may be used.

The indicator element $L_n$ is disconnected from its maximum brightness value when the threshold level $U_s$ is sensed, and the indicator $L_{n+1}$ is brought from extinguished to full brightness condition. To prevent a jump in optical brightness between an elongated scale, the indicator element $L_n$ and the indicator element $L_{n+1}$ are located as closely together as possible, at a position representing the same voltage level of the test or sampling voltage $U_E$. This relationship is indicated in FIGS. 3a and 3b, in which FIG. 3b, at the abscissa, indicates input voltage and, also, physical position of the indicator elements $L_1, L_2 \ldots L_n, L_{n+1}, L_{n+2} \ldots L_{n2}$.

A warning indication may be obtained, at a particular voltage level, by changing the brightness of an indicator element associated with a particular voltage level, or adding additional data or information, for optical representation.

Figure 4:
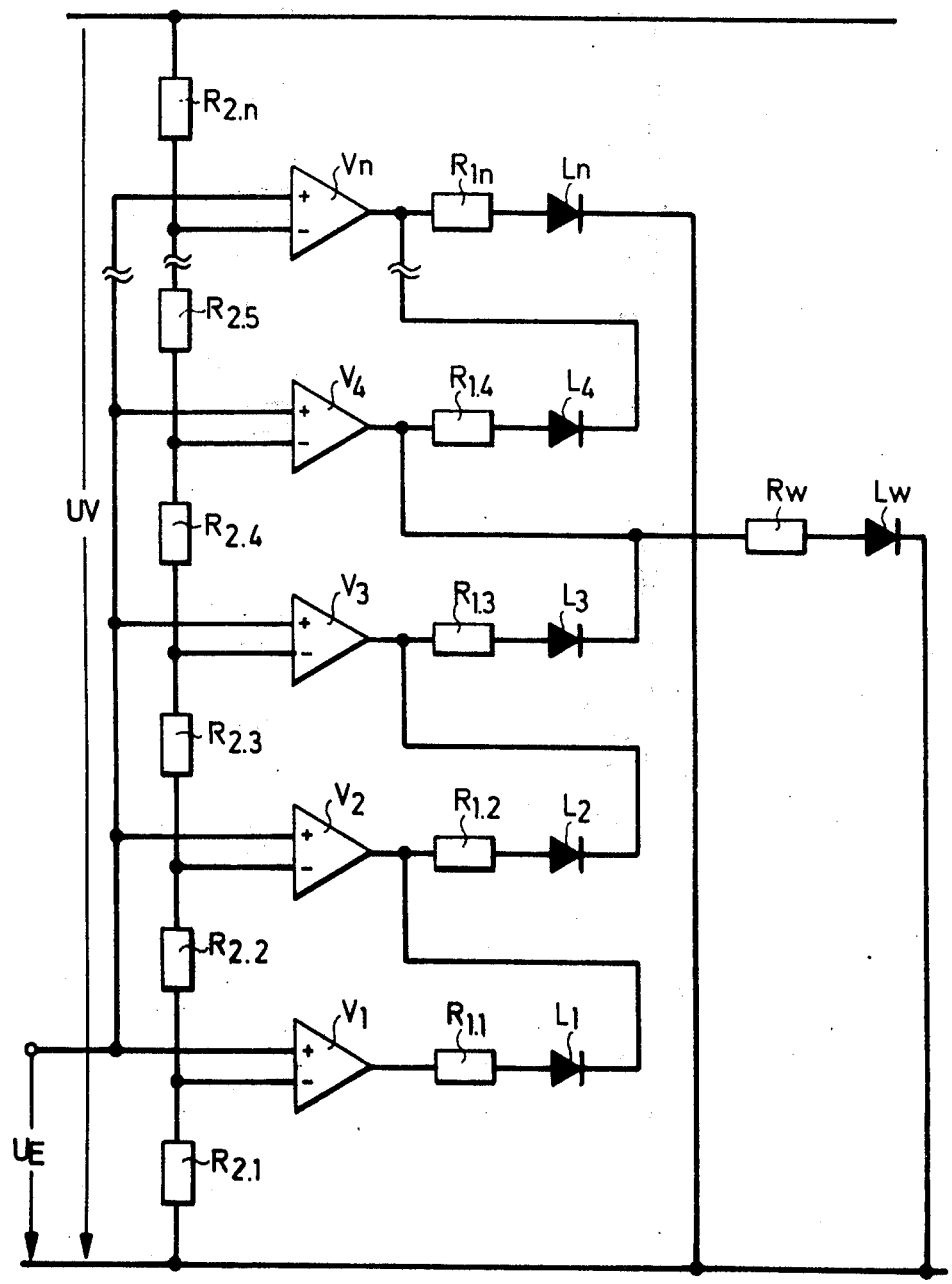
FIG. 4 is a schematic circuit diagram similar to the diagram of FIG. 1 with an additional indicating element to specifically indicate when a threshold voltage value has been exceeded.

FIG. 4 illustrates the connection of an additional LED, $L_W$, and its associated coupling resistor $R_W$, connected to the output of amplifier $V_4$. When a predetermined threshold level is passed, and output is obtained from amplifier $V_4$, LED $L_4$ as well as the warning indicator $L_W$ will light. The cathode of the LED $L_W$ is connected to ground or chassis. The element $L_W$ may have a color of luminescense which differs from that of the other LED's.

Figure 5:
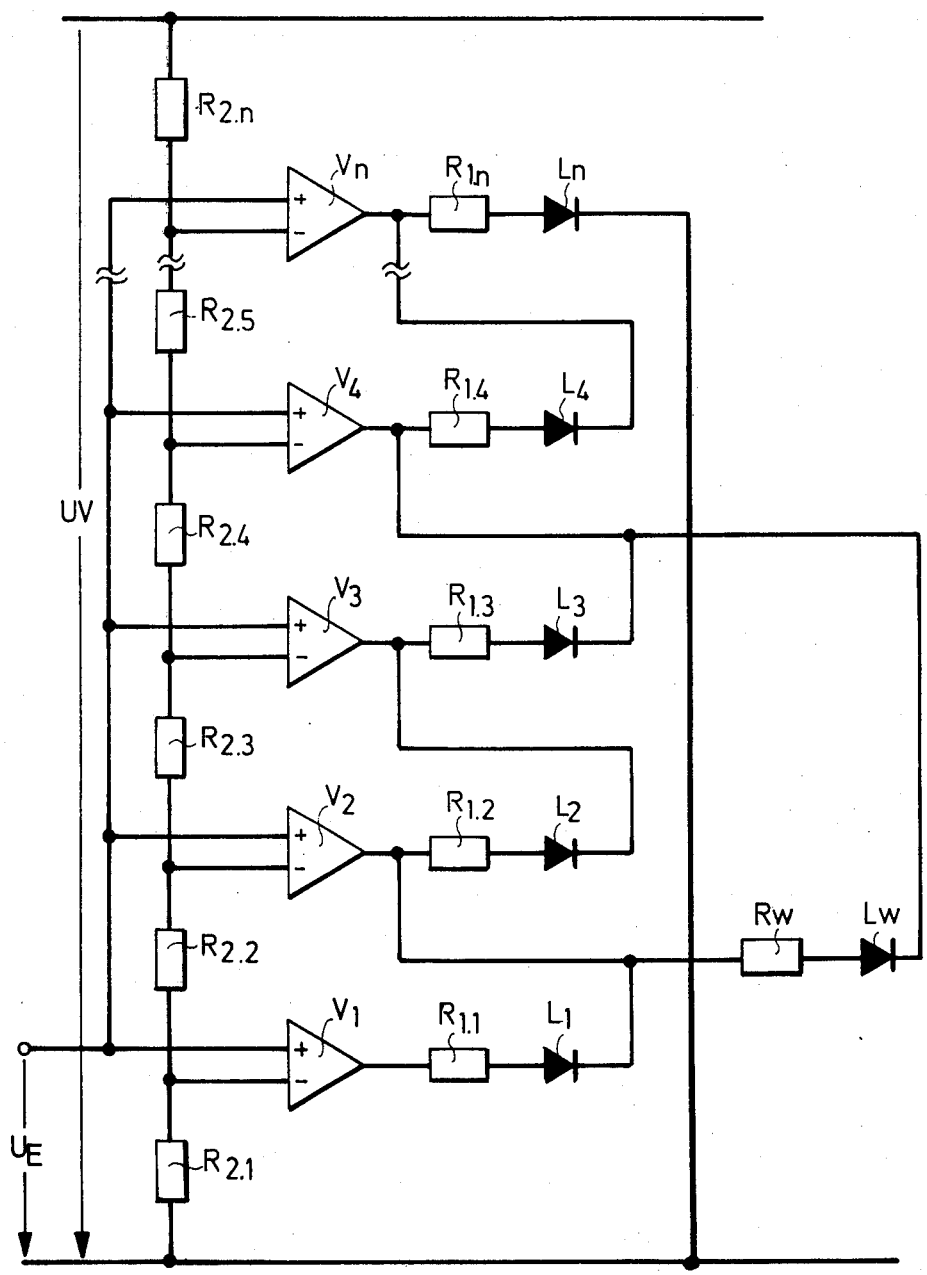
FIG. 5 is a circuit diagram similar to that of FIG. 1 and having an additional indicator element which provides a warning signal between two threshold levels.

An additional indication may also be obtained by indicating when two thresholds are passed. Thus, and referring to FIG. 5, the additional element $L_W$ and its associated coupling resistor need not be connected to chassis, but can be connected between the outputs of two amplifiers, $V_2$ and $V_4$. In the connection of FIG. 5, the additional indicator $L_W$ will provide, in effect, a "coarse" indication of voltage level having twice the range of that to which an individual amplifier $V_2$, $V_3$, for example, responds.

Figure 6:
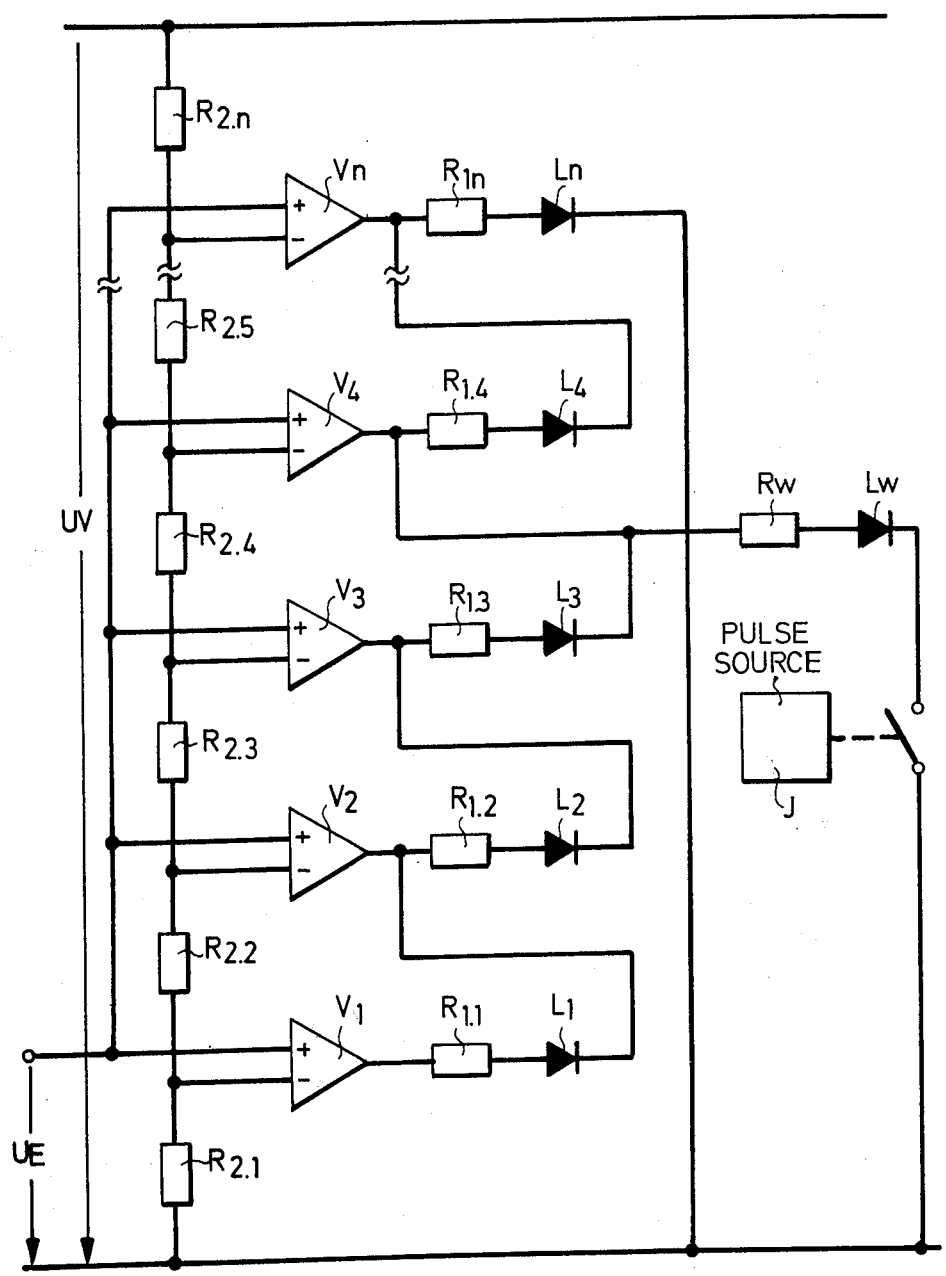
FIG. 6 is a diagram of a circuit similar to FIG. 4 with a pulse source for periodic interruption of the additional indicating element.

The additional indicator $L_W$ is independent of the remainder of the circuit. Thus, the additional indicator can be pulse-operated. Referring to FIG. 6, a pulse source J is provided, connected to intermittently open a switch in the supply or reference connection to chassis of the additional element $L_W$. In the circuit of FIG. 6, the additional indicator $L_W$ will blink when the threshold level associated with amplifier $V_4$ is reached. The pulse source J may, for example, be an electronic circuit, such as a monostable flip-flop which may, for example, be powered directly from the circuit of FIG. 6, for example by taking control voltages across the resistor $R_W$.

Various changes and modifications may be made within the scope of the inventive concept and features described in connection with any one of the embodiments may, likewise, be used with any one of the other embodiments.

When incandescent lamps B are used in the circuit of FIG. 3, the diode D is used since the polarity of the connection of the light-emitting elements changes upon transfer of switch $S_1 \ldots S_4$ to provide for unambiguous indication.

We claim:

1. Luminescent voltage indicator system having a plurality of adjacently located luminescent elements (L) arranged to indicate, by their respective location and specific illumination, the value of an input voltage ($U_E$) to be tested, comprising:
   a plurality of respective difference amplifiers arranged in a chain ($V_1 \ldots V_n$), each associated with a respective luminescent element (L), each difference amplifier having a reference input and a test voltage input and providing an output which is an analog of the voltage difference between the inputs;
   a plurality of serially connected reference resistors ($R_{2.1} \ldots R_{2.n}$) connected across a source of supply voltage ($U_v$);
   one input of the respective difference amplifiers ($V_1 \ldots V_n$) being connected, in an ascending chain, to respective adjacent junctions of the serially connected reference resistors ($R_{2.1} \ldots R_{2.n}$) to apply increasing voltages to said respective inputs of the respect difference amplifiers ($V_1 \ldots V_n$), the test voltage inputs of all the difference amplifiers ($V_1 \ldots V_n$) being all connected to the input test voltage ($U_E$);
   and wherein the output of any difference amplifier ($V_1$) is connected to a respective one terminal of the associated respective luminescent element (L), the other terminal of the respective luminescent element (L) being connected to the output of the next adjacent difference amplifier ($V_2$) in the chain, so that current flow through, and hence brightness of illumination of any luminescent element (L) is dependent on the current flow through, and hence brightness of an adjacent luminescent element to energize the respective luminescent elements (L) by the difference in outputs of adjacent differential amplifiers ($V_1, V_2 \ldots V_n$) and to effect gradual transition of energization of the output from a difference amplifier to another, and hence of brightness of one luminescent element to an adjacent one upon change of test voltage from a level corresponding to the voltage level of the voltage connected to a difference amplifier to the voltage level of the difference amplifier connected to the adjacent luminescent element.

2. System according to claim 1, wherein the difference amplifiers are operational amplifiers, the direct inputs of the operational amplifiers are connected to the voltage to be tested ($U_E$) and the inverting inputs of the respective operational amplifiers are connected to the respectively different voltages.

3. System according to claim 1, wherein (FIG. 1) the luminescent elements are connected in a chain between the outputs of adjacent different amplifiers.

4. System according to claim 1, wherein the luminescent elements are light-emitting diodes.

5. System according to claim 1, wherein the luminescent elements are liquid crystals.

6. System according to claim 1, wherein the luminescent elements are incandescent lamps.

7. System according to claim 6, further comprising a diode, each, connected in series with the incandescent lamp.

8. System according to claim 1, wherein (FIG. 3) the luminescent elements are unilaterally conductive, and wherein a pair of luminescent elements are connected, with opposite polarity, in parallel, each pair of elements being connected to the output of a difference amplifier;
   and transfer switch means ($S_1 \ldots S_4$) are provided connecting, respectively, the said one, or the other of the respective inputs of the difference amplifiers to said respectively different voltages, and the other, or said one of the inputs of the difference amplifiers to said voltage to be tested, said switching means further connecting the luminescent element to a respectively differently polarized source to provide for illumination of one, or the other, of the pair of parallel connected, oppositely polarized luminescent elements in accordance with the polarity of the output voltages applied thereacross as determined by the polarity of the applied voltages to the difference amplifiers, controlled by the setting of the transfer switch means.

9. System according to claim 8, further comprising threshold sensing means (K) connected to operate said switch means and transfer the connection of the switch means when the threshold sensing means has sensed that the test voltage has reached about half the voltage valve of the voltage range of the system.

10. System according to claim 1, further comprising (FIG. 4) additional luminescent indicator means ($L_W$) connected to the output of a selected difference amplifier.

11. System according to claim 1, further comprising (FIG. 5) additional luminescent indicator means ($L_W$) connected between the outputs of selected difference amplifiers.

12. System according to claim 1, further comprising (FIG. 6) control means (J) connected to a selected one of said indicator means to control the instantaneous brightness thereof.

13. System according to claim 12, wherein said control means (J) comprises a pulse source to provide for intermittent operation of said selected one of said indicator means, so that said indicator means, when controlled to be illuminated, will blink.

14. System according to claim 1, wherein the circuit comprising the system is at least in part a monolithic integrated circuit.

15. System according to claim 1, wherein the respectively different voltages to which the difference amplifiers are connected differ from each other by a linear function.

16. System acording to claim 1, wherein the respectively different voltages to which the difference amplifiers are connected differ from each other by a non-linear function.

17. System according to claim 1, wherein the amplification factor of the respective amplifiers (V) is the same.

18. System according to claim 1, wherein the amplification factor of the respective amplifiers (V) is different.

19. Luminescent voltage indicator system having a plurality of adjacently located luminescent elements (L) arranged to indicate, by their respective location and specific illumination, the value of an input voltage ($U_E$) to be tested, and wherein the respective luminescent elements are unidirectionally conductive, comprising a plurality of respective difference amplifiers arranged in a chain ($V_1 \ldots V_n$), each associated with a respective luminescent element (L), each difference amplifier having a reference input and a test voltage input and providing an output which is an analog of the voltage difference between said inputs;

a plurality of serially connected reference resistors arranged in two groups ($R_{2.1} \ldots R_{2.n}$; $R_{3.1} \ldots R_{3.n}$) connected across a source of supply voltage ($U_V$);

the outputs of any differential amplifier ($V_1$) being connected to a pair of luminescent elements, connected in parallel, and with opposite polarity, the parallel connection of the oppositely polarized luminescent element pair having one terminal connected to the output terminal of said difference amplifier and the other terminal of the parallel connected pair being connected to the output of the next adjacent difference amplifier ($V_2$) in the chain, so that current flow, and hence brightness of illumination of any luminescent element is dependent on the current flow through and hence brightness of illumination of an adjacent luminescent element of an adjacent pair;

a threshold switch (K) having a threshold reference voltage ($U_s$) applied thereto as well as said test voltage ($U_E$), and transfer switch means ($S_1$–$S_4$) selectively connecting either the reference inputs or the test voltage inputs of the respective difference amplifiers to respective adjacent junctions of the serially connected reference resistors of one group, or the other ($R_{2.1} \ldots R_{2.n}$; $R_{3.1} \ldots R_{3.n}$) and the test voltage input and reference input, selectively, of all the difference amplifiers to the input test voltage, the output of the respective difference amplifiers changing in polarity in dependence on the switch position of the transfer switch means, and hence on the respective connection of the test voltage input and the reference input of the difference amplifiers to, selectively, the reference resistors, or the input voltage;

change-over of said threshold switch being effected when the test voltage ($U_E$) passes the threshold determined by the threshold voltage ($U_s$) and causes transfer of illumination from the luminescent element, of a pair connected to the output of the respective differential amplifiers to the other, reversely polarized element of the pair.

20. System according to claim 19, wherein the difference amplifiers comprises operational amplifiers, the direct and inverting inputs of which are selectively connected by said transfer switch means.

* * * * *